United States Patent [19]

MacDonald et al.

[11] Patent Number: 5,362,940

[45] Date of Patent: Nov. 8, 1994

[54] USE OF FRESNEL ZONE PLATES FOR MATERIAL PROCESSING

[75] Inventors: Bruce G. MacDonald, San Diego; Robert O. Hunter, Jr., Rancho Santa Fe; Adlai H. Smith; Clark C. Guest, both of San Diego, all of Calif.

[73] Assignee: Litel Instruments, San Diego, Calif.

[21] Appl. No.: 940,008

[22] Filed: Sep. 3, 1992

Related U.S. Application Data

[63] Continuation of Ser. No. 612,212, Nov. 9, 1990, abandoned.

[51] Int. Cl.$^5$ .............................................. B23K 26/00
[52] U.S. Cl. ........................... 219/121.68; 219/121.73; 219/121.76; 219/121.83
[58] Field of Search ....................... 219/121.68, 121.69

[56] References Cited

U.S. PATENT DOCUMENTS 4,909,818  3/1990  Jones ........................... 219/121.68 X

FOREIGN PATENT DOCUMENTS 4106423  10/1991  Germany .

OTHER PUBLICATIONS

Engel, et al., "Laser Machining with Modulated Zone Plates", Applied Optic Feb. 1974, vol. 13, No. 2, pp. 169-273.
Moran, et al., "Laser Machining with a Holographic Lens", Applied Optic Feb. 1971, vol. 10, No. 2, pp. 412-415.
Campbell, et al., "Materials processing with $CO_2$ laser holographic scanner systems", Applied Optics, 1 Dec. 1978, vol. 17, No. 23, pp. 3727-3737.
Gallagher, et al., "Infrared Holographic Optical Elements with Applications to Laser Material Processing", IEEE Journal of Quantum Electronics, vol. QE-15, No. 12, Dec. 1979, pp. 1369-1381.

Primary Examiner—C. L. Albritton
Attorney, Agent, or Firm—Townsend and Townsend Khourie and Crew

[57] ABSTRACT

The apparatus for machining and material processing includes an excimer laser and a Fresnel zone plate array (FZP) positioned parallel to the workpiece, with the distance between the FZP and the workpiece being the focal length of the FZP. For each hole to be formed on the workpiece a corresponding Fresnel zone is patterned onto the FZP. Each Fresnel zone may be patterned directly centered over the desired hole location or in high density patterns it may be located off-center from the hole with deflection being accomplished by the formation of finer circular arcs on the side of the Fresnel zone opposite the desired direction of deflection. A beam scanner is included to provide a more uniform illumination of the FZP by the laser beam. The scanning eliminates non-uniformity of intensity. The alignment mechanism uses a helium-neon laser, the beam from which is projected onto a surface relief grating on the workpiece. The reflected light from the surface relief grating is filtered to create interference fringes which, when aligned, provide maximum light intensity projected through a transmission grating on the Fresnel zone plate.

40 Claims, 2 Drawing Sheets

USE OF FRESNEL ZONE PLATES FOR MATERIAL PROCESSING

This application is a continuation of application Ser. No. 612,212, filed Nov. 9, 1990, now abandoned.

BACKGROUND OF THE INVENTION

Very small holes of arbitrary contours are important for many applications, including fabricating vias in printed circuit boards and integrated circuit packages. Traditional mechanical means of forming vias, such as drills or punches, are capable of forming vias as small as 0.004 inch (0.10 mm). Below this limit, lithographic or optical techniques must be used.

One of the optical techniques for micro-machining is direct ablation with a laser focused onto the workpiece with a microscope. Vias are drilled one-at-a-time with the stage on which the workpiece sits scanning to the next via to be formed, repeating the procedure until all of the vias are formed. This technique may include the use of a patterned metal mask over the surface of the substrate so that the laser ablates material only through the openings in the metal. After ablation the metal can be patterned or removed as the design requires. The processing quality of this method is limited in that it takes a relatively long time to complete a single workpiece.

Lithographic techniques include determining the pattern of vias with photoresist then subjecting the workpiece to reactive ion etch. The photoresist is subsequently removed leaving the vias patterned in the workpiece. The reactive ion etch involves the use of a very expensive piece of equipment, and several additional process steps are required for patterning, etch and photoresist strip.

It is known that laser machining can be done using modulated zone plates, holographic optical elements and binary phase gratings. These diffractive optics are more efficient than mask-based techniques, theoretically being capable of directing 100% of the incident light into a desired image. However, these diffractive optics techniques are limited in that many of them are only capable of generating a periodic matrix of spots, and they often require a refractive lens for focusing which may reduce efficiency and introduce aberrations and distortion.

SUMMARY OF THE INVENTION

It is an advantage of the present invention to provide a system which uses diffractive optics techniques to form an arbitrary pattern for machining and material processing.

It is a further advantage of the present invention to permit the simultaneous processing of multiple areas within the field of view using approximately parallel beams of uniform power, and without having to step or scan the stage on which the workpiece is mounted.

In an exemplary embodiment the apparatus for drilling vias or holes in a circuit board includes an excimer laser and a Fresnel zone plate (FZP) positioned parallel to the circuit board, with the distance between the FZP and the circuit board being the focal length of the FZP. For each via to be formed in the circuit board a corresponding FZP is patterned onto an FZP array. Each FZP may be patterned directly centered over the desired via location or in high density patterns it may be located off-center from the via with deflection being accomplished by the formation of finer circular arcs on the side of the FZP opposite the desired direction of deflection.

A beam scanner is included to provide a more uniform illumination of the FZP by the laser beam. The scanning eliminates non-uniformity of intensity.

The alignment mechanism uses a helium-neon laser, the beam from which is projected onto a surface relief grating on the workpiece. The reflected light from the surface relief grating is filtered to create interference fringes which, when aligned, provide maximum light intensity projected through a transmission grating on the Fresnel zone plate.

The FZP may be patterned to provide any contour hole by producing the pattern of the Fourier transform of the desired hole shape.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
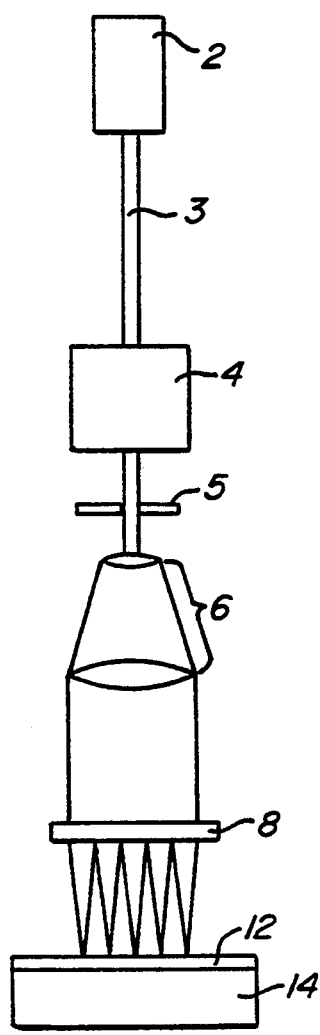
FIG. 1 is a diagrammatic view of the material processing system according to the preferred embodiment.

In the preferred embodiment shown in FIG. 1, the material processing system comprises a processing laser 2 for emitting beam 3, a beam scanner 4, a spatial filter 5, a beam expander/collimator optical train 6, a Fresnel zone plate array 8 and an alignment subsystem 10. The workpiece, illustrated as a circuit board 12 is mounted on stage 14.

Processing laser 2 is an excimer laser, which provides a single pulse brightness in ultraviolet light much greater than that emitted by other commercial lasers. The preferred excimer laser is KrF which emits at 248 nm and provides a power of 400 mJ/pulse for a 20 nsec pulse. This particular laser is selected for its ability to ablate polyimide which is used for printed circuit boards and alumina ($Al_2O_3$) which is used in ceramic packaging.

Beam scanner 4 is included to alleviate laser intensity non-uniformities. The laser beam quality has been optimized for focusing the laser to obtain a beam diameter as required by the specifications of a circuit board. However these beam quality modifications generate a speckle pattern which decreases the uniformity of the laser intensity. Laser uniformity is an important parameter because it affects the diameter of the via. Since the polyimide has an energy threshold below which little ablation occurs, the profile of the laser beam will have the effect that a higher intensity pulse will be wider at the ablation threshold because the tails of the beam profile have increased in intensity. This results in an increase in hole diameter which creates a nonuniform distribution of hole diameters across the circuit board 12, possibly exceeding specified tolerances.

Figure 5:
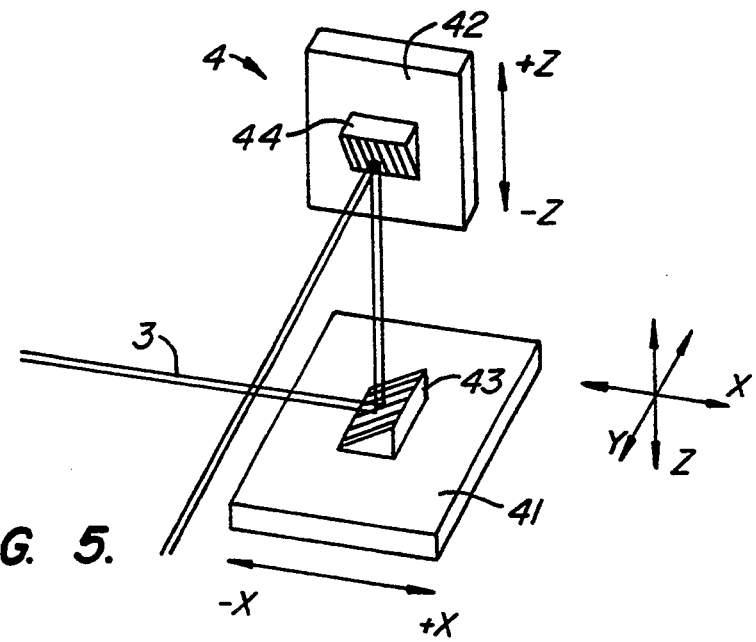
FIG. 5 is a perspective view illustrating motion for the beam scanner.

Beam scanner 4 alleviates the nonuniform intensity of the beam by causing the beam to continuously scan across a narrow region such that it overlaps itself at all locations during the scan. The beam scanner 4, shown in FIG. 5, consists of two stages 41 and 42 with reflectors 43 and 44. Stage 41 oscillates continuously in ±x-direction with reflector 43 mounted thereon at a 45° angle. Motion of stage 41 in ±x-direction causes the beam to move in the ±x-direction at the target plane while motion of stage 42 in ±z-direction causes the beam to move in the ±z-direction at the target plane. By appropriately programming the motion of stages 41 and 42, any desired scanning pattern in the target plane can be achieved. Stages 41 and 42 have tight pitch and yaw specifications so that the motion does not introduce any beam tilt.

Spatial filter 5 is a pinhole provided to permit spatial filtering of the input beam. The pinhole rejects highly divergent components of the laser beam.

Beam expander/collimator optical train 6 is illustrated a simple combination of lenses which expand the beam 3 to match the beam size to the workpiece then collimate the expanded beam. A more complex multiple lens telescope may also be used for precise magnification and speed, suggested values being 6:1 and f/20, respectively.

Fresnel zone plates (FZPs) are structures for focusing light that can be readily mass produced in arbitrary arrangements. They therefore provide an effective means for etching patterns of holes using laser light. A single substrate can be imprinted with a large number of FZPs using standard lithographic techniques. The operating principle of FZPs is the diffraction of light. The principle of diffraction states that a lightwave will not travel in a straight path after passing through a small aperture (small meaning comparable in size to the wavelength), but will expand outward to fill the space behind the aperture. Thus, light beams passing through a screen with two or more apertures will overlap and combine. Because light is a wave, it has peaks and troughs in its amplitude. When beams combine, a peak in one beam may be cancelled by a trough in another, leaving that location dark. This is called destructive interference. Likewise, at other locations, beams will combine so that two peaks or two troughs come together. This increases the amplitude of light at those locations and is called constructive interference. A screen with the correct pattern of apertures can be used to focus light. Light at the focus should have as high an amplitude as possible. Therefore, only apertures that contribute constructively interfering light to the focus position should be open in the screen. Whether an aperture contributes constructive or destructive light depends on the distance of the aperture from the focus. If one selects a particular aperture at a given distance from the focus, then all other apertures at that same distance to within plus or minus one quarter of a wavelength will contribute constructive light. Furthermore, all apertures within a quarter wavelength of that distance plus or minus an integer number of wavelengths will also contribute constructive light. The pattern that results if all constructive aperture locations on a screen are transparent and all destructive locations are opaque is a series of concentric rings with the spacing of the rings becoming closer for rings further from the center of the pattern. This pattern of rings is an FZP.

Figure 3A:
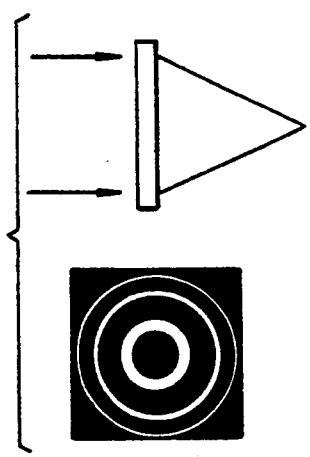
FIGS. 3a, 3b and 3c illustrate three different Fresnel zone plate configurations to achieve beam tilt.
Figure 3B:
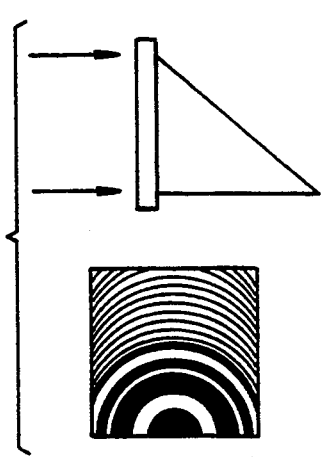
Figure 3C:
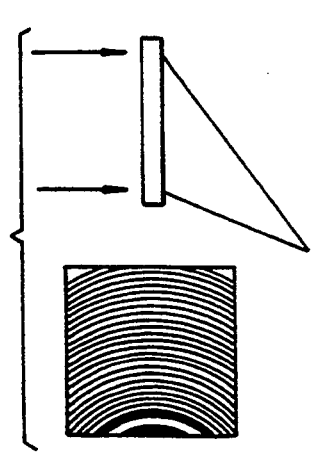

The total amplitude of light at the focus can be increased by using the light that would ordinarily be blocked by the opaque rings of the FZP. Destructive light can bet turned to constructive light by changing its phase by one half a wavelength. Thus, by replacing the opaque rings of FZP, such as shown in FIGS. 3a, 3b and 3c; with a thickness of transparent material that delays the by one half wavelength, those regions can also constructively contribute to the focus, thereby doubling the total light amplitude. The FZPs illustrated in FIG. 2 exemplify such a configuration. Materials etched by light at the focus react not to light amplitude, but to light intensity which is the square of the amplitude. Thus, doubling the amplitude increases the potential for etching by a factor of four.

Figure 4A:
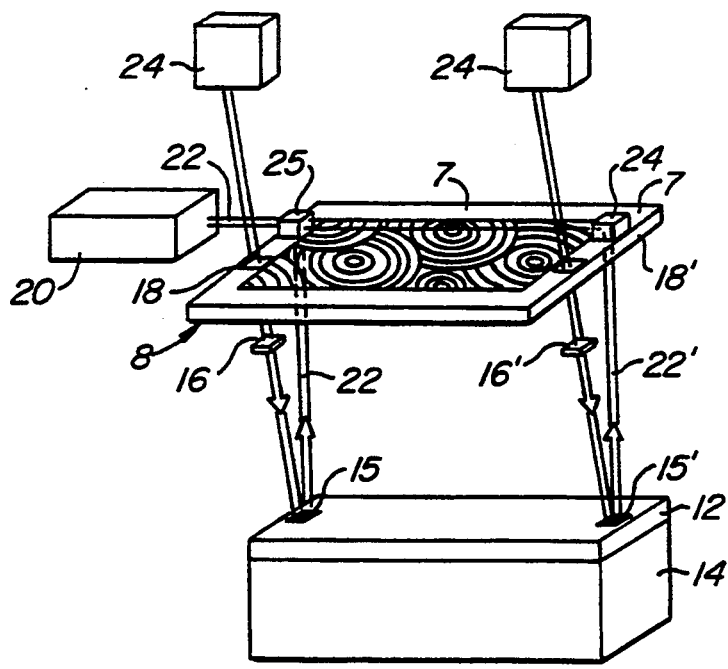
FIG. 4a is a perspective view and FIG. 4b is a side view of the alignment subsystem.
Figure 2:
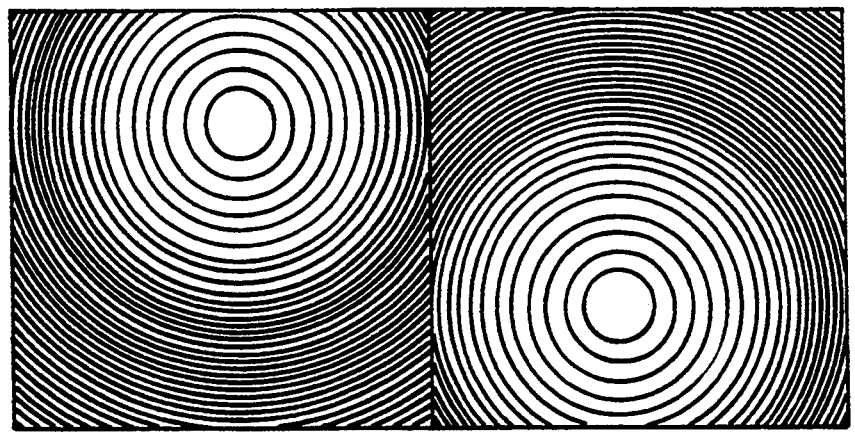
FIG. 2 illustrates a Fresnel zone plate array.

The procedure for fabricating a Fresnel zone plate involves the preparation of a mask using electron beam lithography. Since E-beam lithography involves directly "writing" the pattern into photoresist on the chrome mask plate, it is relatively little additional work to pattern a large number of zones on a single mask. The location of each zone is determined by the pattern of beam projection desired to simultaneously process selected locations of a workpiece. As shown in FIG. 4a, the perimeter of the FZP array may be a clear unpatterned area 7 on the order of 1 cm wide to permit inclusion of alignment features. After etching of the exposed chrome (under the unexposed resist) and stripping of the resist, a mask is created bearing a pattern of the desired FZP array. An example of such a pattern with partially overlapping FZPs is shown in FIG. 2. The ability to partially overlap the zones permits relatively close and arbitrary positioning of the selected areas of the workpiece as required. It should also be noted that the FZPs and the selected area on the workpiece corresponding need not be limited to a circular shape. By patterning the FZP as the Fourier transform of the desired shape virtually any shape via or hole can be drilled, including squares, polygons, asymmetric shapes, etc.

The mask is used to pattern photoresist on a quartz plate by projecting light through the mask to expose the resist. After exposure, the quartz is etched using either wet chemical (HF) or reactive ion etch (RIE). Wet etch can be used only where small spacing between the lines on the plate is not critical, because the isotropic nature of the wet etch results in undercut of the resist, making dimensions difficult to control. RIE, an anisotropic etch, is preferred and is necessary to achieve narrow spacing between the lines with well-defined vertical steps.

The design of an FZP is as follows: the radius of the k-th circle that separates the rings of the zone is given by $\sqrt{k\lambda f}$, where $\lambda$ is the wavelength of light emitted by the processing laser 2 and f is the focal length of the Fresnel zone. The total number of bright and dark rings in a Fresnel zone with radius R is $K = R^2/\lambda f$. The width of the narrowest ring, which determines the resolution required for fabrication, is $\sqrt{k\lambda f} - \sqrt{(k-1)\lambda f}$. The etch depth of the quartz, which can be achieved by either etch technique, is $L = k/[4(n-1)]$, where n is the refractive index of quartz, about 1.55. Etching precisely to this depth will give the highest optical power at the focused spot.

In the preferred embodiment of the system, FZP array 8 is positioned parallel to the circuit board 12, 50 millimeters away. Thus, the focal length of the FZP is 50 mm. The holes drilled in the circuit board 12 are 12.5 microns in diameter. The holes are randomly positioned on the workpiece and may be as close as 75 microns center-to-center. To etch 12.5 micron holes from a distance of 50 mm, the FZPs must be 1 mm in diameter, using zones centered over the holes as seen in FIG. 3a. To allow holes to approach to within 75 microns, the FZPs must be able to produce holes that are not centered behind the FZP, but deflected to one side as in FIGS. 3b and 3c. For a large diameter zone plate, any selected 1 mm square area of that pattern directs light to the focus behind the center of the pattern. Therefore, FZPs designed to produce holes not centered under them will be 1 mm square areas selected from the outer portion of larger FZPs. The more the hole is deflected from the center of the FZP, the finer the circular arcs of the FZP opposite the direction of deflection, as shown in FIG. 3c. Thus, the maximum deflection is limited by the minimum resolution of the fabrication process. The pitch P of the arcs is determined according to the relationship $P = \lambda / 2 \sin \eta$ where $\Theta$ is the angle of deflection. If features as fine as 0.5 microns can be-fabricated, then holes may be placed up to 4.5 mm from the center of the corresponding FZP element. These specifications will allow writing a diagonal line of holes on a 75 micron grid.

Figure 4B:
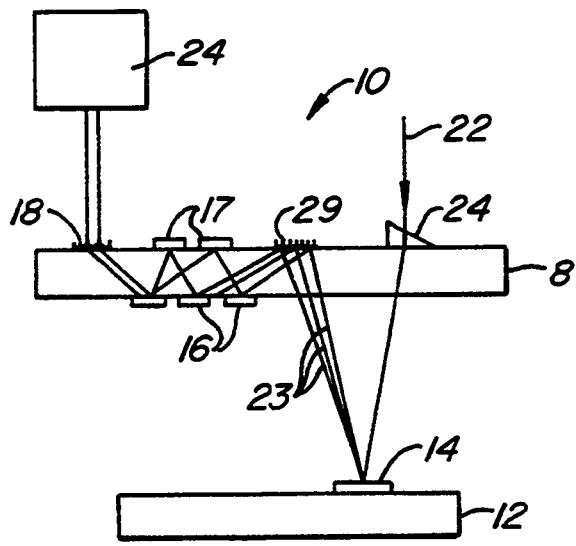

Alignment subsystem 10 is shown in FIG. 4. Reference laser 20 emits light within the visible spectrum, for example, a helium-neon laser (632.8 nm). Alignment beam 22 is projected toward a reflective prism 24 attached to the perimeter of FZP 8 which directs beam 22 through a clear area 7 of FZP toward a location on the circuit board 12 at which is patterned a surface relief grating 14. Note than the prism 24 projects beam 22 at a slight angle toward grating 14. This is necessary to permit the reflected beam to pass through a different location than directly back to prism 24. When beam 22 strikes grating 15 it is split into several diffracted orders which are reflected back toward the FZP array through a blocking filter 16 which filters the reflected light, removing all diffracted orders except the $-1$ and $+1$. As shown in FIG. 4b, visible light beam 22 passes through refractive prism 24 which causes beam 22 to leave Fresnel zone plate array 8 at an angle. Beam 22 strikes surface relief grating 14 on workpiece 12. Grating 14 breaks beam 22 into multiple diffracted orders 23. Diffracted orders 23 are reflected and focused by reflective grating lens 29. Beams 23 reflect a second time off mirrored surface 16, which is patterned to reflect the $+1$ and $-1$ order diffracted beams but to stop the 0th order and all other beams. The $+1$ and $-1$ order diffracted beams encounter reflective bumps 17 on top surface of 8. Purpose of bumps 17 is that beam 22 may be scanned through small angles, causing the $+1$ and $-1$ beams to move onto and off of bumps 17. As they do so, their relative phases are modulated. Beams reflect once more off of 16 and from an interference pattern at the plane of transmission grating 18. Proper alignment of workpiece t2 and plate 8 gives the maximum signal to detector 24. Phase modulation of beams produced by bumps 17 serves to rock the interference pattern back and forth, sending a modulated signal to detector 24. This modulated signal is suitable for synchronous detection which gives high accuracy and noise immunity. Mirrored surface 16 may be placed on the underside of FZP array 8 or may be a separate component. The transmission and combination of the $-1$ and $+1$ diffracted orders create interference fringes which then pass through transmission grating 18 which is preferably patterned on the perimeter of FZP array 8. Transmission grating 18 may alternately be a separate component. The light passing through the transmission grating 18 is measured at detector 24 to determine the total amount of light passed. By adjusting the rotation tilt and/or lateral movement of the FZP 8 or the stage 14 on which the circuit board 12 is mounted, the maximum intensity of light transmitted through transmission grating 18 is achieved, indicating alignment.

The above alignment procedure is preferably performed at two or more locations which may be facilitated by placing beamsplitter 25 between laser 20 and reflective prism 24 to provide two separate beams 22 and 22' which impact gratings 15 and 15', respectively to permit the above-described alignment procedure at two locations.

In an alternate embodiment, alignment subsystem 30, using a reference laser 20 as above, directs a reference beam through a reticle which has a set of alignment marks patterned at two of its edges. A corresponding set of alignment marks is located on the workpiece onto which reference beam is focused by the use of a Fresnel lens. The alignment marks are partially reflective, reflecting the beam back through the reticle and alignment marks thereon. A camera looks at the images carried by the reflected beam to determine whether complete overlap and, thus, alignment has been achieved.

The material processing method and system of the present invention permits many locations to be processed simultaneously, providing high system throughput while efficiently using available laser power. The processing steps for producing FZPs by standard lithographic techniques allow arbitrary patterning for customization of plates in accordance with a user's requirements. The alignment subsystem permits repeatable positioning further allowing whole field stepping to increase throughput.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A method of processing a plurality of selected locations on a workpiece by projecting arbitrary working patterns onto said workpiece at preselected locations, said method comprising the steps of:
providing a plate having an array of discrete diffractive regions, each discrete diffractive region focusing light incident on said plate at a discrete focal distance from said plate in an arbitrary working pattern corresponding to a selected discrete location on said workpiece;
aligning said plate with respect to said workpiece for simultaneous focus of each discrete diffraction region in said arbitrary working pattern at one of said plurality of selected locations; and
projecting an incident beam through said array of discrete diffractive regions on said plate whereby each said discrete diffractive region produces said arbitrary working pattern at each selected discrete location.

2. A method as in claim 1 wherein the step of, providing a plate includes configuring said discrete diffractive region as a function of the Fourier transform of said arbitrary working pattern.

3. A method as in claim 1 wherein the step of providing a plate includes providing to at least two of said discrete diffractive optic regions differing focal lengths and differing focal directions.

4. A method as in claim 1 wherein the step of providing a plate includes providing phase delay media to at least one of said diffractive optic regions.

5. A method as, in claim 1 wherein the step of providing a plate includes providing at least one diffractive region with a projected arbitrary working pattern which is selected from a group including squares, polygons, and asymmetric shapes.

6. A method as in claim 1 wherein the step of providing a plate includes providing at least one said diffractive region partially overlapping a second adjacent diffractive optic region.

7. A method as in claim 1 wherein the step of providing a plate includes providing at least one discrete diffractive region having a plurality of rings each being separated by a width of radius $R = \sqrt{k\lambda f}$ where $\lambda$ is a wavelength of said light, f is a focal length of said discrete diffractive region and k is an identification number of the ring for which the width is being determined.

8. A method as in claim 7 wherein the step of providing a plate includes determining the resolution for a fabrication of said at least one discrete diffractive region according to the width of the narrowest said ring $\sqrt{k\lambda f} - \sqrt{(k-1)\lambda f}$.

9. A method as in claim 1 wherein the step of providing a plate includes providing at least one discrete diffractive region by etching said plate to a depth of $\lambda/4(n-1)$ where $\lambda$ is a wavelength of said light and n is a refractive index of said plate.

10. A method as in claim 1 wherein the step of providing a plate includes the step of providing at least one discrete diffractive region having a plurality of rings in a quantity according to the equation $K = R^2/\lambda f$ where R is a radius of said discrete diffractive region, $\lambda$ is a wavelength of said light and f is a focal length of said discrete diffractive region.

11. A method as in claim 1 wherein the step of projecting includes deflecting a portion of said incident beam projected through at least one discrete diffractive region at an angle $\Theta$ from perpendicular at a center of said at least one discrete diffractive region.

12. A method as in claim 11 wherein the step of providing at least one discrete diffractive region includes determining according to said angle $\Theta$ a pitch of a plurality of rings of said at least one diffractive region according to the equation $P = \lambda/2 \sin \Theta$ where k is a wavelength of said light.

13. A method as in claim 1 wherein the step of aligning said plate includes positioning said plate substantially parallel to said workpiece.

14. A method as in claim 1 wherein the step of projecting an incident processing beam includes the step of scanning said beam.

15. A method as in claim 1 wherein the step of providing a plate includes providing said discrete diffractive regions of same sizes.

16. A method as in claim 1 wherein the step of providing a plate includes providing discrete diffractive regions having alternating opaque and transparent regions.

17. A method as in claim 1 wherein said discrete diffractive regions project constructively-interfering portions of said arbitrary working pattern.

18. A method as in claim 1 wherein said discrete diffractive regions project destructively-interfering portions of said arbitrary working pattern.

19. A method as in claim 1 wherein the step of projecting comprises projecting an incident processing beam through a plurality of diffractive optic regions simultaneously.

20. An apparatus for processing a plurality of selected locations on a workpiece by projecting arbitrary working patterns onto said workpiece at preselected locations, said apparatus comprising:
a light source for generating an incident processing beam; and
a plate having an array of diffractive regions, each diffractive region focusing said incident processing beam at a discrete focal distance from said plate in an arbitrary working pattern corresponding to a discrete preselected location on said workpiece.

21. An apparatus as in claim 20 wherein said diffractive region is configured as a function of the Fourier transform of said arbitrary working pattern.

22. An apparatus as in claim 20 wherein at least two diffractive optic regions within said array have differing focal lengths and differing focal directions.

23. An apparatus as in claim 20 wherein at least one diffractive region includes transmissive phase delay media.

24. An apparatus as in claim 20 wherein said at least one diffractive region has a projected arbitrary working pattern which is selected from a group including squares, polygons, and asymmetric shapes.

25. An apparatus as in claim 20 wherein at least one diffractive region partially overlaps a second adjacent diffractive region.

26. An apparatus as in claim 20 wherein at least one diffractive region comprises a plurality of rings, said rings being separated by a width of radius $\sqrt{k\lambda f}$ where $\lambda$ is a wavelength of said light, f is a focal length of said diffractive region and k is the number of the ring for which said width is being determined.

27. An apparatus as in claim 20 wherein at least one diffractive region is etched into said plate to a depth of $\lambda/4(n-1)$ where $\lambda$ is a wavelength of said light and n is a refractive index of said plate.

28. An apparatus as in claim 20 wherein at least one diffractive region has a plurality of rings in a quantity according to the equation $K = R^2/\lambda f$ where R is a radius of said discrete diffractive region, $\lambda$ is a wavelength of said light and f is a focal length of said diffractive region.

29. An apparatus as in claim 20 wherein at least one diffractive region deflects said incident beam at an angle 8 from perpendicular to a center of said at least one diffractive region.

30. An apparatus as in claim 29 wherein at least one diffractive region comprises a plurality of rings having a pitch determined according to said angle $\Theta$ according to the equation $P = \lambda/2 \sin \Theta$ where $\lambda$ is a wavelength of said light.

31. An apparatus as in claim 20 wherein the diffractive regions of said array are of a same size.

32. An apparatus as in claim 20 wherein said diffractive region comprises alternating opaque and transparent rings.

33. An apparatus as in claim 20 wherein said diffractive region projects constructively-interfering portions of said arbitrary working pattern.

34. An apparatus as in claim 20 wherein said diffractive region projects destructively-interfering portions of said arbitrary working pattern.

35. An apparatus as in claim 20 wherein said array of diffractive regions focuses a plurality of arbitrary working patterns onto said workpiece simultaneously.

36. A method of processing a plurality of selected locations on a workpiece by simultaneously focusing a plurality of beams carrying an arbitrary working pattern onto said workpiece, said method which comprises:

projecting a reference beam of light from a reference laser through a plurality of first alignment marks on a transparent plate located above said workpiece;

aligning said plurality of first alignment marks with a plurality of second alignment marks on said workpiece; and projecting an incident processing beam through a diffractive optic array having a plurality of diffractive regions, one diffractive region corresponding to each selected location on said workpiece for focussing an arbitrary working pattern thereon, thereby creating a plurality of processing beams, each carrying a corresponding arbitrary working pattern, one processing beam corresponding to each selected location.

37. An apparatus for processing a workpiece by focussing a plurality of beams carrying arbitrary working patterns onto selected areas of said workpiece, one beam corresponding to each selected area, said apparatus comprising:

a light source for generating an incident processing beam having at least one wavefront; and a diffractive optic array having a plurality of diffractive regions, each diffractive region corresponding to one said selected area, said wavefront impinging upon said diffractive optic array causing one said beam to be projected from each said diffractive region, said beam being focused on and carrying its arbitrary working pattern to its corresponding said selected area.

38. A method of processing a plurality of selected locations on a workpiece by projecting arbitrary working patterns onto said workpiece at preselected locations, said method comprising the steps of:

providing a plate having an array of discrete diffractive regions, each discrete diffractive region focusing light incident on said plate at a discrete focal distance from said plate in an arbitrary working pattern corresponding to a selected discrete location on said workpiece;

aligning said plate with respect to said workpiece for simultaneous focus of each discrete diffraction region in said arbitrary working pattern at one of said plurality of selected locations; and continuously scanning an incident beam sequentially through said array of discrete diffractive regions on said plate whereby each said discrete diffractive region produces said arbitrary working pattern at each selected discrete location.

39. The process of claim 38 and wherein said continuously scanning step includes:

continuously scanning said beam across a narrow region on said plate.

40. The process of claim 39 and wherein said continuously scanning step includes:

continuously scanning said beam across narrow regions of said plate with said scans overlapping themselves.

* * * * *